US011894217B2

(12) United States Patent
Jung et al.

(10) Patent No.: US 11,894,217 B2
(45) Date of Patent: Feb. 6, 2024

(54) PLASMA IGNITION OPTIMIZATION IN SEMICONDUCTOR PROCESSING CHAMBERS

(71) Applicant: Applied Materials, Inc., Santa Clara, CA (US)

(72) Inventors: Soonwook Jung, Campbell, CA (US); Kenneth D. Schatz, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/112,207

(22) Filed: Feb. 21, 2023

(65) Prior Publication Data

US 2023/0197405 A1 Jun. 22, 2023

Related U.S. Application Data

(63) Continuation of application No. 17/100,927, filed on Nov. 22, 2020, now Pat. No. 11,587,765.

(51) Int. Cl.
*H01J 37/32* (2006.01)
*H01L 21/311* (2006.01)

(52) U.S. Cl.
CPC .. *H01J 37/32082* (2013.01); *H01J 37/32926* (2013.01); *H01L 21/31116* (2013.01); *H01J 2237/334* (2013.01)

(58) Field of Classification Search
CPC ........... H01J 37/32082; H01J 37/32926; H01J 2237/334; H01L 21/31116
See application file for complete search history.

(56) References Cited

U.S. PATENT DOCUMENTS 6,273,022 B1 * 8/2001 Pu .................. H01J 37/321
118/723 MR
7,127,358 B2 * 10/2006 Yue .................... G05B 13/048
700/32

(Continued)

FOREIGN PATENT DOCUMENTS

CN 115605974 A 1/2023
JP 2006286306 A 10/2006

(Continued)

OTHER PUBLICATIONS

Application No. PCT/US2021/059759, International Search Report and Written Opinion, dated Mar. 14, 2022, 10 pages.

*Primary Examiner* — Kurtis R Bahr
(74) *Attorney, Agent, or Firm* — Kilpatrick Townsend & Stockton LLP

(57) ABSTRACT

A method of reducing reflected Radio Frequency (RF) power in substrate processing chambers may include accessing input parameters for a processing chamber that are derived from a recipe to perform a process on a substrate. The input parameters may be provided to a model that has been trained using previous input parameters and corresponding sensor measurements for the chamber. A predicted amount of reflected RF power may be received from the model and it may be determined whether the predicted reflected RF power is optimized. The input parameters may be repeatedly adjusted and processed by the model until input parameter values are found that optimize the reflected RF power. Optimized input parameters may then be provided to the chamber to process the substrate.

20 Claims, 11 Drawing Sheets

(56) References Cited

U.S. PATENT DOCUMENTS

| | | | |
|---|---|---|---|
| 7,624,003 B2* | 11/2009 | Yamartino | G05B 17/02 |
| | | | 703/6 |
| 9,721,759 B1 | 8/2017 | Karlquist et al. | |
| 11,276,564 B2* | 3/2022 | Gottscho | H01J 37/3299 |
| 11,587,765 B2 | 2/2023 | Jung et al. | |
| 2015/0084509 A1 | 3/2015 | Yuzurihara et al. | |
| 2016/0307736 A1* | 10/2016 | Howald | H01J 37/32183 |
| 2017/0103872 A1* | 4/2017 | Howald | H01J 37/32183 |
| 2017/0228482 A1* | 8/2017 | Tetiker | G06F 30/39 |
| 2020/0205245 A1* | 6/2020 | Ma | H05B 6/6473 |
| 2022/0115206 A1* | 4/2022 | Hammond | H01J 37/32183 |

FOREIGN PATENT DOCUMENTS

| | | |
|---|---|---|
| KR | 20200071024 A | 6/2020 |
| TW | 201801573 A | 1/2018 |
| TW | 201820937 A | 6/2018 |
| WO | 2022109049 A1 | 5/2022 |

\* cited by examiner

PLASMA IGNITION OPTIMIZATION IN SEMICONDUCTOR PROCESSING CHAMBERS

CROSS-REFERENCES TO RELATED APPLICATIONS

This application is a continuation of U.S. application Ser. No. 17/100,927, filed Nov. 22, 2020, the content of which is hereby incorporated by reference in its entirety for all purposes.

TECHNICAL FIELD

This disclosure relates to semiconductor systems, processes, and equipment. More specifically, this disclosure relates to training and/or using models to optimize an amount of reflected Radio Frequency (RF) power that is returned to an RF source during plasma ignition.

BACKGROUND

In the manufacture of integrated circuits and other electronic devices, plasma processes are often used for deposition or etching of various material layers. Plasma-enhanced chemical vapor deposition (PECVD) process is a chemical process wherein electro-magnetic energy is applied to at least one precursor gas or precursor vapor to transform the precursor into a reactive plasma. Plasma may be generated inside the processing chamber, i.e., in-situ, or in a remote plasma generator that is remotely positioned from the processing chamber. This process is widely used to deposit materials on substrates to produce high-quality and high-performance semiconductor devices.

Plasmas used in the processing chamber may be ignited by providing radio frequency (RF) energy to the chamber from an RF source. The voltages/currents provided by the RF source may be tightly controlled such that energy can be provided uniformly to the plasma. However, variations in the conditions of the processing chamber and/or equipment between substrate processes may cause variations in how quickly a plasma can be ignited. Input parameters for the control system and the RF source may quickly ignite a plasma in one session, then cause a delay in plasma ignition during a subsequent session using identical parameters. When the plasma fails to ignite quickly, RF energy may be reflected back into the RF source. This can damage the RF source, cause defects in the substrate, and increase the difficulty of igniting the plasma.

Therefore, there is a need for improved systems and methods that can be used to optimize the input parameters that are part of a recipe for processing chambers to minimize the amount of RF power reflected back into the RF source. These and other technical problems are solved by the embodiments disclosed herein.

SUMMARY

In some embodiments, a method of reducing reflected Radio Frequency (RF) power in substrate processing chambers may include accessing a plurality of input parameters for a processing chamber, where the plurality of input parameters may in part be derived from a recipe for the processing chamber to perform a process on a substrate. The method may also include providing the plurality of input parameters for the processing chamber to a model, where the model may have been trained using previous pluralities of input parameters and corresponding pluralities of sensor measurements. The method may additionally include receiving one or more first outputs from the model that indicate a predicted first amount of RF power that will be reflected back from the processing chamber to an RF source when igniting a plasma in the processing chamber. The method may further include determining that the predicted first amount of RF power that is reflected back from the processing chamber is not optimized. The method may also include adjusting the plurality of input parameters for the processing chamber to generate adjusted input parameters, providing the adjusted input parameters for the processing chamber to the model, and receiving one or more second outputs from the model that indicate a predicted second amount of RF power that will be reflected back from the processing chamber to the RF source. The method may additionally include determining that the predicted second amount of RF power that is reflected back from the processing chamber is optimized, and providing the adjusted input parameters to the processing chamber to perform the process on the substrate.

In some embodiments, a system may include one or more processors and one or more memory devices including instructions that, when executed by the one or more processors, cause the one or more processors to perform operations including accessing a plurality of input parameters for a processing chamber, where the plurality of input parameters may in part be derived from a recipe for the processing chamber to perform a process on a substrate. The operations may also include providing the plurality of input parameters for the processing chamber to a model, where the model may have been trained using previous pluralities of input parameters and corresponding pluralities of sensor measurements. The operations may additionally include receiving one or more first outputs from the model that indicate a predicted first amount of RF power that will be reflected back from the processing chamber to an RF source when igniting a plasma in the processing chamber. The operations may further include determining that the predicted first amount of RF power that is reflected back from the processing chamber is not optimized. The operations may also include adjusting the plurality of input parameters for the processing chamber to generate adjusted input parameters, providing the adjusted input parameters for the processing chamber to the model, and receiving one or more second outputs from the model that indicate a predicted second amount of RF power that will be reflected back from the processing chamber to the RF source. The operations may additionally include determining that the predicted second amount of RF power that is reflected back from the processing chamber is optimized, and providing the adjusted input parameters to the processing chamber to perform the process on the substrate.

In some embodiments, a non-transitory computer-readable medium may include instructions that, when executed by one or more processors, cause the one or more processors to perform operations including accessing a plurality of input parameters for a processing chamber, where the plurality of input parameters may in part be derived from a recipe for the processing chamber to perform a process on a substrate. The operations may also include providing the plurality of input parameters for the processing chamber to a model, where the model may have been trained using previous pluralities of input parameters and corresponding pluralities of sensor measurements. The operations may additionally include receiving one or more first outputs from the model that indicate a predicted first amount of RF power that will be reflected back from the processing chamber to an RF source when igniting a plasma in the processing chamber. The operations may further include determining that the predicted first amount of RF power that is reflected back from the processing chamber is not optimized. The operations may also include adjusting the plurality of input parameters for the processing chamber to generate adjusted input parameters, providing the adjusted input parameters for the processing chamber to the model, and receiving one or more second outputs from the model that indicate a predicted second amount of RF power that will be reflected back from the processing chamber to the RF source. The operations may additionally include determining that the predicted second amount of RF power that is reflected back from the processing chamber is optimized, and providing the adjusted input parameters to the processing chamber to perform the process on the substrate.

In any embodiments, any and all of the following features may be implemented in any combination and without limitation. The method/operations may also include accessing a plurality of training data sets, where each of the plurality of training data sets may include a plurality of previous input parameters from a previous process and corresponding sensor data representing an amount RF power that was reflected back from the processing chamber during the process. The method/operations may also include training the model using the plurality of training data sets. The method/operations may also include curating the plurality of training data sets such that the plurality of training data sets includes at least a threshold number of training data sets comprising sensor data representing above-average amounts of RF power that was reflected back in the processing chamber. The model may include a neural network that may include a plurality of hidden layers and inputs corresponding to the input parameters. The neural network may include a first output indicating a predicted maximum RF power and a second output indicating a predicted RF power duration. The neural network may have been trained using an optimization process to set weights between internal nodes of the neural network. The process may include a plasma etch process on the substrate. The plurality of input parameters may include settings for an RF source for the processing chamber. The plurality of input parameters may include a wafer count representing a number of processes previously executed on substrates in the processing chamber. The plurality of input parameters may include a chamber idle time representing a time since a previous plasma process was completed in the processing chamber. The plurality of input parameters may include an identifier for a previous recipe executed in the processing chamber. The plurality of input parameters may include preset values for one or more tuning capacitors in the processing chamber. The plurality of input parameters may include preset values for one or more tuning inductors in the processing chamber. Determining that the predicted second amount of RF power that is reflected back from the processing chamber is optimized may include determining that the second amount of RF power represents a minimum value of reflected RF power predicted by the model over a range of values for each of the plurality of input parameters, and/or determining that the second amount of RF power is less than a predetermined threshold. The predetermined threshold may be approximately 50 W. The method/operations further may include measuring sensor data representing an amount of RF power that is reflected back from the processing chamber during the process; and comparing the measured sensor data to the predicted second amount of RF power. The method/operations may also include generating an indication provided to a user interface when the measured sensor data exceeds the predicted second amount of RF power by more than a predetermined threshold amount.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

DETAILED DESCRIPTION

Power may be reflected back to an RF source in plasma chambers. The unpredictable variation in reflected power, along with the magnitude of the reflected power represents a technical challenge when igniting a plasma that may negatively affect the process and the processing chamber itself in a number of ways. First, a correlation has been observed between the magnitude of the reflected power and the defect rate in the corresponding substrate in the process. Whether reflected power is higher during plasma ignition, there tends to be a higher defect rate in the corresponding substrate. Second, the plasma becomes harder to ignite as more power is reflected, resulting in longer ignition times and further increasing the amount of reflected power. Third, the reflected power itself can be harmful to the RF source. If the reflected power becomes excessive and/or too frequent, the RF source may be damaged. Therefore, improvements are needed to reduce the magnitude of the reflected power during plasma ignition and to more accurately predict the magnitude of reflected power.

The embodiments described herein improve processing chamber technology by solving these and other technical problems. Specifically, these embodiments reduce the magnitude of reflected power and increase the predictability of this process by using a trained model to predict the reflected power output based on at least a portion of the input parameters for a current session. If the model outputs a value that is not optimized, the input parameters may be adjusted. For example, the voltage output by the RF source may be increased. The adjusted input parameters may then be passed back into the model to predict a new amount of reflected power. This process of processing input parameters using the model and determining whether the corresponding output is optimized may continue until an optimal set of input parameters has been discovered. The process may then be carried out using the optimized input parameters to achieve a minimal and predictable amount of reflected RF power.

Figure 1:
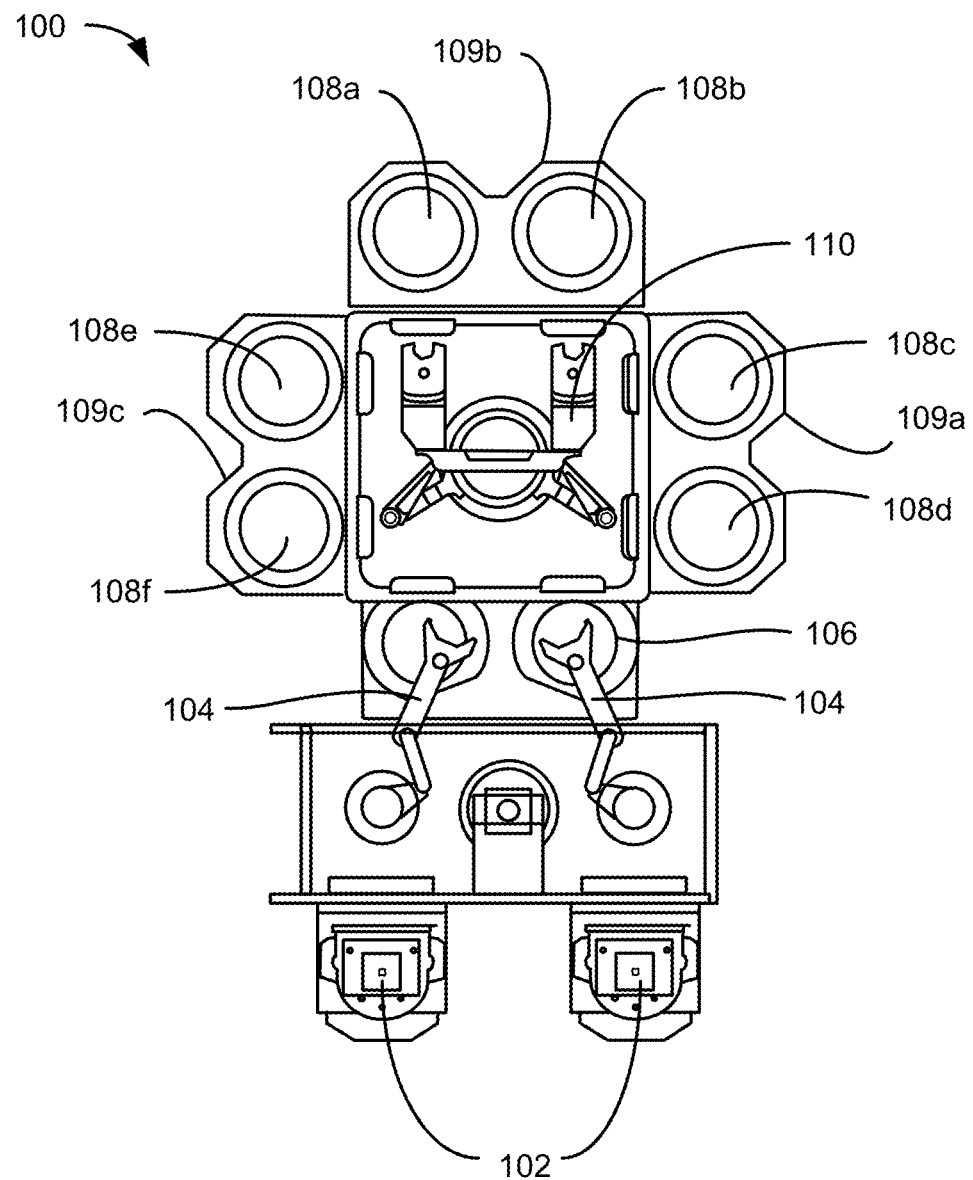
FIG. 1 illustrates a top plan view of a processing system of deposition, etching, baking, and curing chambers according to some embodiments.

FIG. 1 illustrates a top plan view of a processing system 100 of deposition, etching, baking, and curing chambers according to some embodiments. A pair of front opening unified pods 102 may supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, may be outfitted to perform a number of substrate processing operations, including formation of stacks of semiconductor materials, plasma-enhanced chemical vapor deposition, atomic layer deposition, physical vapor deposition, etch, pre-clean, degas, orientation, and/or other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2A:
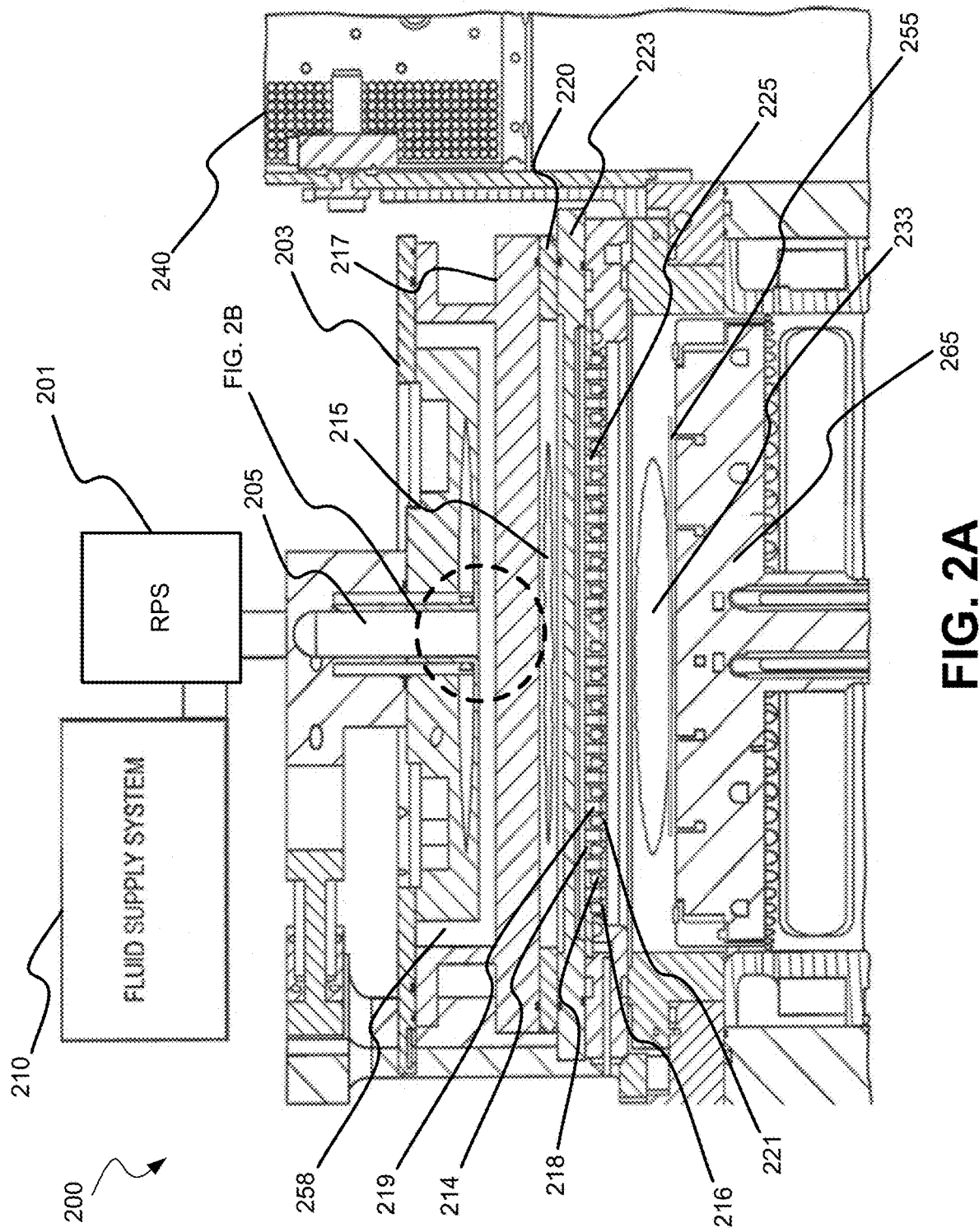
FIG. 2A illustrates a cross-sectional view of an exemplary process chamber system 200 with partitioned plasma generation regions within the processing chamber, according to some embodiments.

FIG. 2A illustrates a cross-sectional view of an exemplary process chamber system 200 with partitioned plasma generation regions within the processing chamber, according to some embodiments. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The gas inlet assembly 205 may include two or more distinct gas supply channels where the second channel (not shown) may bypass the RPS 201, if included.

A cooling plate 203, faceplate 217, ion suppressor 223, showerhead 225, and a pedestal 265 or substrate support, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may include aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the gas supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region, such as the first plasma region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from first plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or substrate processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the first plasma region 215. This in turn may allow development of particular plasma characteristics such that precursors may be dissociated in specific ways to enhance the etching profiles produced by these precursors.

A plasma may be ignited either in first plasma region 215 above showerhead 225 or substrate processing region 233 below showerhead 225. Plasma may be present in first plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in first plasma region 215 during deposition. An RF power supply may generate a high RF frequency of 13.56 MHz but may also generate other frequencies alone or in combination with the 13.56 MHz frequency.

Figure 2B:
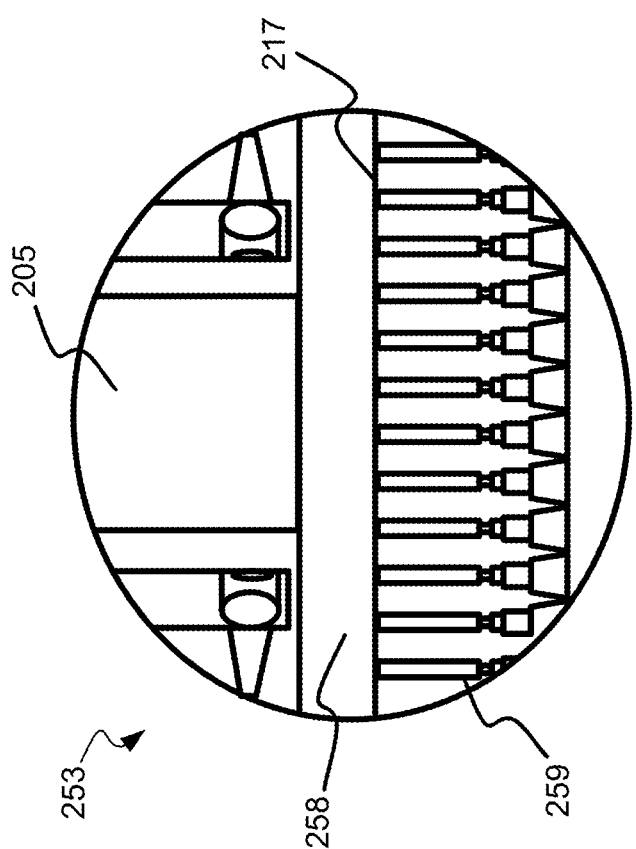
FIG. 2B illustrates a detailed view of the features affecting the processing gas distribution through faceplate, according to some embodiments.

FIG. 2B illustrates a detailed view 253 of the features affecting the processing gas distribution through faceplate 217, according to some embodiments. As shown in FIGS. 2A and 2B, faceplate 217, cooling plate 203, and gas inlet assembly 205 intersect to define a gas supply region 258 into which process gases may be delivered from gas inlet assembly 205. The gases may fill the gas supply region 258 and flow to first plasma region 215 through apertures 259 in faceplate 217. The apertures 259 may be configured to direct flow in a substantially unidirectional manner such that process gases may flow into substrate processing region 233, but may be partially or fully prevented from backflow into the gas supply region 258 after traversing the faceplate 217.

Figure 3:
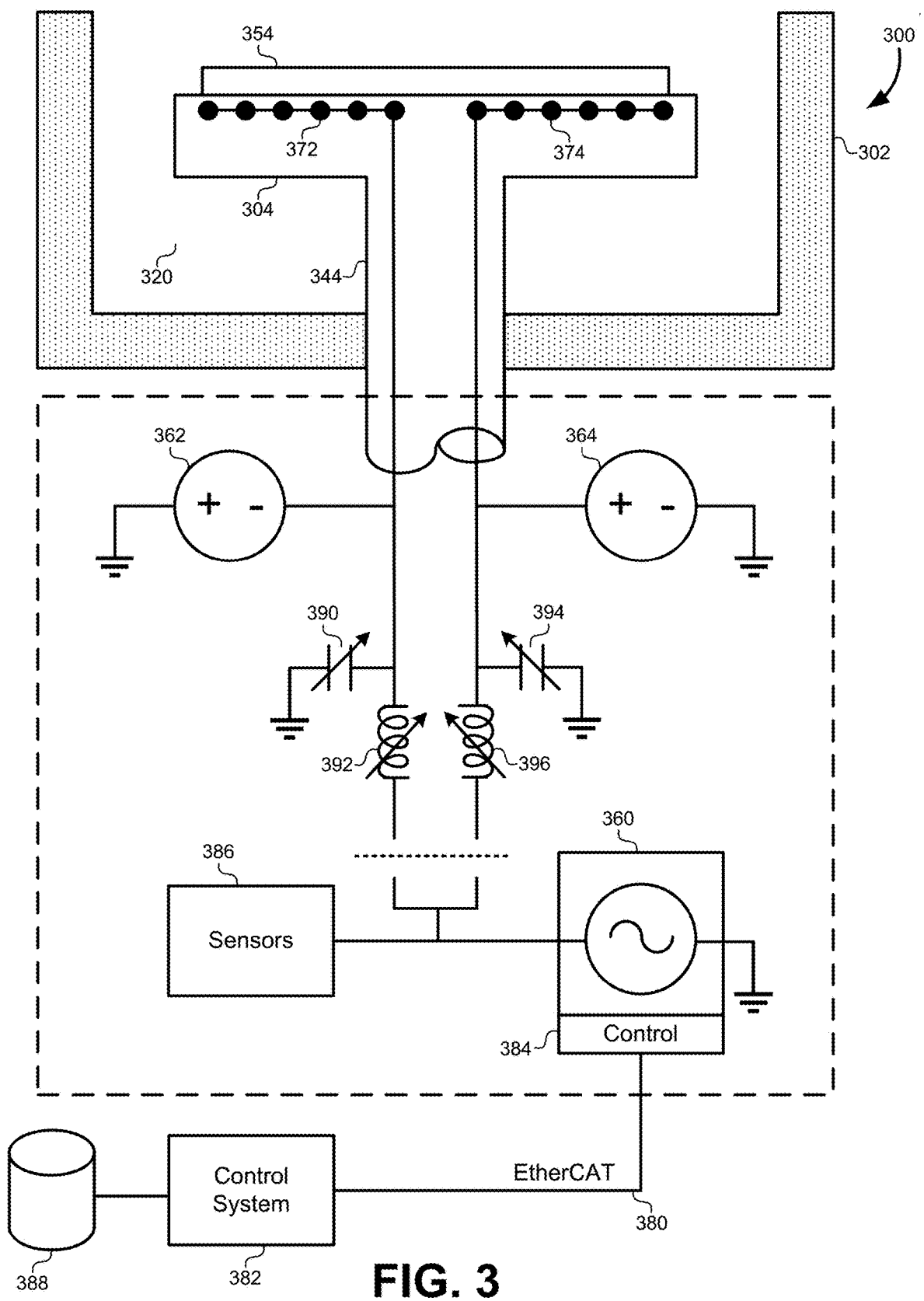
FIG. 3 illustrates a cross-sectional view of a portion of a processing chamber, according to some embodiments.

The gas distribution assemblies such as showerhead 225 for use in the processing chamber section 200 may be referred to as dual channel showerheads and are additionally detailed in the embodiments described in FIG. 3. The dual channel showerhead may provide for etching processes that allow for separation of etchants outside of the substrate processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the showerhead 225.

FIG. 3 illustrates a cross-sectional view of a portion of a processing chamber 300, according to some embodiments. As shown, the processing chamber 300 may be an etch chamber suitable for etching a substrate 354. It is contemplated that other processing chambers may be adapted to benefit from these embodiments. The processing chamber 300 may be used for various plasma processes. For example, the processing chamber 300 may be used to perform dry etching with one or more etching agents. The processing chamber may be used for ignition of plasma from a precursor $C_xF_y$ (where x and y represent values for known compounds), $O_2$, $NF_3$, or combinations thereof. In another example, the processing chamber 300 may be used for a plasma-enhanced chemical vapor deposition (PECVD) process with one or more precursors.

The processing chamber 300 may include a chamber body 302 and a support assembly 304. The processing chamber may also include a lid assembly, and electrode, a gas distributor plate, openings for admitting process gas into the processing volume 320, conduit, a heater, a gas distributor plate, and/or any of the other elements of a processing chamber described above. These elements have been omitted from FIG. 3 for simplicity in order to focus on the electrical system for providing RF power to the processing volume 320.

The support assembly 304 may be coupled to a lift mechanism through a shaft 344, which extends through a bottom surface of the chamber body 302. The lift mechanism may be flexibly sealed to the chamber body 302 by a bellows that prevents vacuum leakage from around the shaft 344. The lift mechanism may allow the support assembly 304 to be moved vertically within the chamber body 302 between a transfer position and a number of process positions to place the substrate 354 in proximity to the electrode 308.

The support assembly 304 may be formed from a metallic or ceramic material. For example, a metal oxide, nitride, or oxide/nitride mixture may be used such as aluminum, aluminum oxide, aluminum nitride, an aluminum oxide/nitride mixture, and/or other similar materials. In typical implementations, one or more pedestal electrodes may be included in the support assembly 304. One or more pedestal electrodes may be configured to deliver RF energy to a plasma in the processing volume 320. For example, an RF source 360 may be provided outside of the chamber body 302 to provide RF energy to one or more pedestal electrodes 372, 374 in the support assembly 304. The RF energy may be transferred through the one or more pedestal electrodes to a gas in the processing volume 320 to generate a plasma. The plasma may be maintained above the substrate 354 to deposit a layer of material on the substrate 354. In order to uniformly deposit material on the substrate 354, the energy transferred to the plasma should be maintained uniformly across the surface area of the substrate 354.

A method known as bipolar chucking may be used with a first pedestal electrode 372 and a second pedestal electrode 374. Bipolar chucking is a method of applying a DC voltage difference between the first pedestal electrode 372 and the second pedestal electrode 374. This electrostatic difference serves to hold the substrate 354 to the support assembly 304. This may be contrasted with monopolar chucking where only a single pedestal electrode is used, or where a DC voltage is only applied to a single pedestal electrode. Monopolar chucking only becomes effective when energy is applied to the plasma to complete the circuit. Bipolar chucking uses two separate electrical paths from the RF source 360 to each of the first pedestal electrode 372 and the second pedestal electrode 374. In the example of FIG. 3, a first DC voltage source 362 is applied to a first electrical pathway for the first pedestal electrode 372. A second DC voltage source 364 is applied to a second electrical pathway for the second pedestal electrode 374. Although not shown explicitly in FIG. 3, the first and second electrical pathways may include capacitors, inductors, or other methods for isolating the DC voltage sources 362, 364 from each other. For example, a pair of relatively large capacitors (e.g., 50 nF) meeting placed in each of the electoral pathways to block the DC voltages from each other.

The first pedestal electrode 372 and the second pedestal electrode 374 may be provided in the support assembly 304. The first pedestal electrode 372 and the second pedestal electrode 374 may be embedded within the support assembly 304 and/or coupled to a surface of the support assembly 304. The first pedestal electrode 372 and the second pedestal electrode 374 may be a plate, a perforated plate, a mesh, a wire screen, or any other distributed conductive arrangement. Although FIG. 3 illustrates only two pedestal electrodes, other embodiments may use more than two pedestal electrodes having different geometries and/or arrangements in the support assembly 304 as described in detail below.

The RF source 360 may provide RF power to the pedestal electrodes 372, 374, each of which may be placed in a different portion of the support assembly 304. In order to fine-tune the RF power delivered to each of the pedestal electrodes 372, 374, tuning capacitors 390, 394 and/or tuning inductors 392, 396 may be provided in the circuit pathways. Although both tuning capacitors 390, 394 and tuning inductors 392, 396 are illustrated for each of the electrical pathways in FIG. 3, this is not meant to be limiting. Some embodiments may use only tuning capacitors 390, 394, while other embodiments may use combinations of the tuning capacitors 390, 394 and/or the tuning inductors 392, 396 in any combination and without limitation. The tuning capacitors 390, 394 and/or the tuning inductors 390, 396 may be adjustable, such that their capacitance/inductance values may be changed by an operator or automatically by a control system. Adjusting these values allows the system to balance the RF energy provided to the first pedestal electrode 372 and/or the second pedestal electrode 374 in order to compensate for minor differences in circuit pathway lengths, resistances, or other physical properties of the different electrical pathways for providing RF power to the processing volume 320.

The RF source 360 may be controlled by a local control system 384. The local control may include a communication interface to communicate with a control system 382. The control system 382 may include a computing system as described below in FIG. 11. For example, the control system 382 may include one or more processors and one or more memory devices that store instructions that cause the one or more processors to perform operations such as delivering input parameters to the RF source 360. The control system 382 may deliver commands through a communication bus 380, for example, using the EtherCAT communication protocol. The control system 382 may provide input parameters to the RF source 360 that control the output frequency, output voltage, output current, and/or timings of the output of the RF source 360. For example, the control system 382 may send serial commands to the RF source 360 that cause the RF source 360 to output a sinusoidal output signal having a frequency of 13.56 MHz.

As used herein, a "session" may refer to a process performed in the processing chamber 300, such as a plasma etch or other similar process. For example, a substrate 354 or wafer may be loaded onto the support assembly 304 as described above, gases may be provided to the processing volume 320, a plasma may be ignited by providing RF energy from the RF source 360 and thereafter controlled to perform a plasma etch. At the conclusion of the session, the substrate 354 may be removed from the processing chamber 300, and the processing chamber body 302 may undergo an inter-wafer chamber cleaning (ICC) process to remove gases from the processing chamber 300 and prepare the processing chamber 300 to receive another substrate in a subsequent session.

The control system 382 may include a database 388 that is configured to store input data and/or output data for each session. The input data that may be stored may include any or all of the input parameters for the processing chamber 300 during the session. These input parameters may include settings for the RF source 360 including output magnitudes, frequencies, timings, and/or other electrical characteristics; gas mixtures, flowrates, timing, pressures, types, and/or other gas properties; and chamber pressure, chamber temperature, timings for voltages applied to the chamber, session timings, and/or other operating characteristics of the processing chamber 300. Some embodiments may also store input parameters that include a historical wafer count of sessions performed on the processing chamber 300, a previous recipe run on the processing chamber 300, capacitor/inductor presets for tuning the RF power as described above, a chamber idle time between a previous session, and/or other characteristics of the current session. These input parameters may be part of a "recipe" that defines the operating characteristics of the processing chamber 300 during a session. Different recipes may be loaded into the control system 382, and the processing chamber 300 can be configured to perform different processes on different substrates by providing a different recipe from the control system 382 during each session. These input parameters may be stored in the database 388 and associated with each session as it is completed. The resulting database 388 may therefore include a history or record of each of the input parameters for the processing chamber during each previous session.

Some embodiments may also provide one or more sensors 386. The sensors 386 may include a voltage sensor and/or a current sensor that are configured to detect RF energy that is reflected back to the control 360. When initially igniting a plasma, some of the RF energy directed to the processing chamber 300 may not be initially absorbed by the plasma, and may instead be reflected back to the RF source 360. The sensors 386 may measure the magnitude and width of reflected power pulses that are received back from the processing volume 320. The sensors 386 may be implemented with any voltage and/or current sensor that are known in the art. For example, some RF sources may be equipped with an internal reflected power sensor that can monitor up to one second of reflected power from the chamber. Some embodiments may also include reflected power sensors that are EtherCAT compatible that can measure reflected power measurements on the order of 1 ms or less. The sensors 386 may measure voltage and/or current waveforms and calculate a maximum power (Watts) that is reflected back to the RF source 360. The database 388 may also store the sensor measurements that were recorded during each session. Therefore, for each session, the database 388 may include a stored set of input parameters along with a stored set of sensor measurements.

Figure 4B:
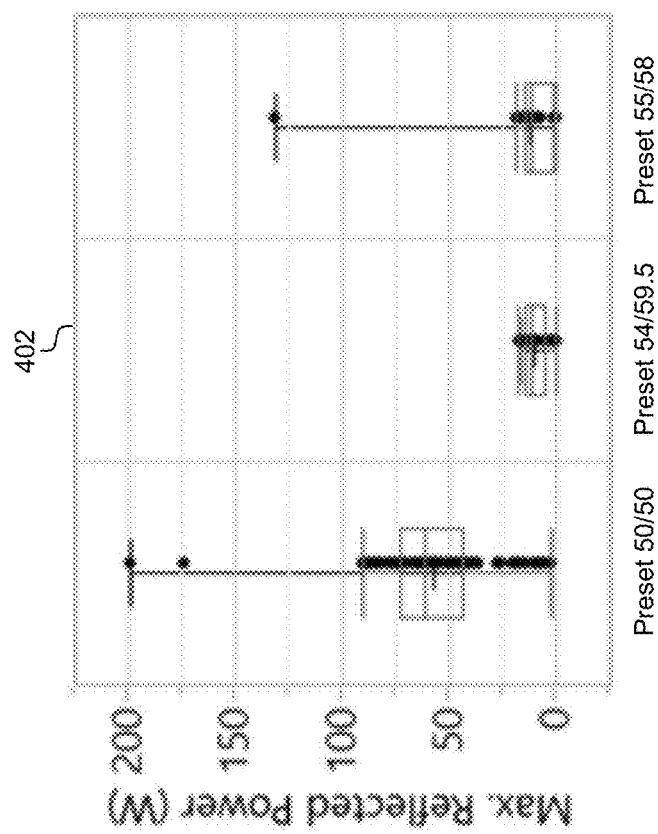
FIG. 4B illustrates a graph of the maximum reflected power measured by the sensors for different values of one of the input parameters, according to some embodiments.
Figure 4A:
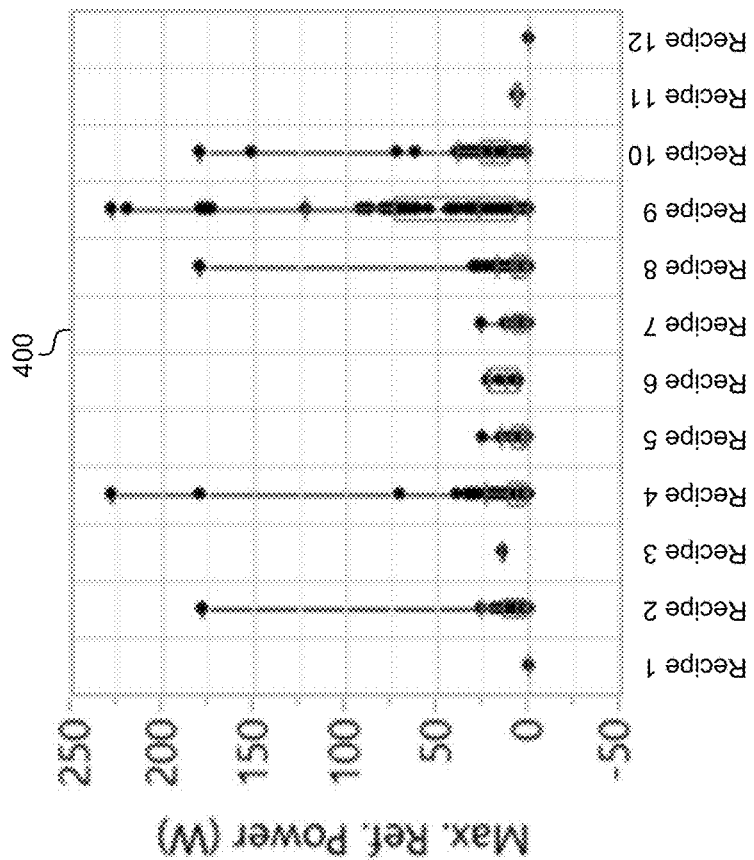
FIG. 4A illustrates a graph of the maximum reflected RF power measured by the sensors for different recipes, according to some embodiments.

Ideally, executing the same recipe repeatedly on the same processing chamber would generate similar results. Specifically, using the same input parameters for the RF source would ideally always generate the same reflected RF power when igniting the plasma. This would allow the input parameters to be optimized one time for the recipe and processing chamber, and then be reused repeatedly in the future to generate similar results. However, it has been discovered that executing the same recipe on the same process chamber often results in a wide variation in the amount of reflected RF power in different sessions. FIG. 4A illustrates a graph 400 of the maximum reflected RF power measured by the sensors for different recipes, according to some embodiments. Graph 400 shows an maximum amounts of reflected power for 12 different recipes, each of which were run on the same processing chamber. Although most of the data points for the reflected power for each of the recipes can be grouped together below 50 W-100 W, many outlier data points may also be observed. This illustrates how the same process can result in vastly different amounts of reflected power from the RF source. Similarly, FIG. 4B illustrates a graph 402 of the maximum reflected power measured by the sensors for different values of one of the input parameters, according to some embodiments. Specifically, the values for the tuning capacitors on two different electrical pathways to the support assembly are illustrated for each of the data groupings. While the 54/59.5 values illustrate a tight grouping of data points below 50 W, both of the other two capacitor values in the graph 402 illustrate wider groupings and outliers that are more than 100 W. Note that these values refer to a percentage of an adjustable position of an adjustable capacitance as a percentage of a total range. For example, for an adjustable capacitor with a range of 0-1000 pF, the 54 number referenced in FIG. 4B would correspond to approximately 540 pF.

The unpredictable variation in reflected power, along with the magnitude of the reflected power represents a technical challenge when igniting a plasma that may negatively affect the process and the processing chamber itself in a number of ways. First, a correlation has been observed between the magnitude of the reflected power and the defect rate in the corresponding substrate in the process. Whether reflected power is higher during plasma ignition, there tends to be a higher defect rate in the corresponding substrate. Second, the plasma becomes harder to ignite as more power is reflected, resulting in longer ignition times and further increasing the amount of reflected power. Third, the reflected power itself can be harmful to the RF source. If the reflected power becomes excessive and/or too frequent, the RF source may be damaged. Therefore, improvements are needed to reduce the magnitude of the reflected power during plasma ignition and to more accurately predict the magnitude of reflected power.

The embodiments described herein improve processing chamber technology by solving these and other technical problems. Specifically, these embodiments reduce the magnitude of reflected power and increase the predictability of this process by using a trained model to predict the reflected power output based on at least a portion of the input parameters for a current session. If the model outputs a value that is not optimized, the input parameters may be adjusted. For example, the voltage output by the RF source may be increased. The adjusted input parameters may then be passed back into the model to predict a new amount of reflected power. This process of processing input parameters using the model and determining whether the corresponding output is optimized may continue until an optimal set of input parameters has been discovered. The process may then be carried out using the optimized input parameters to achieve a minimal and predictable amount of reflected RF power.

Figure 5:
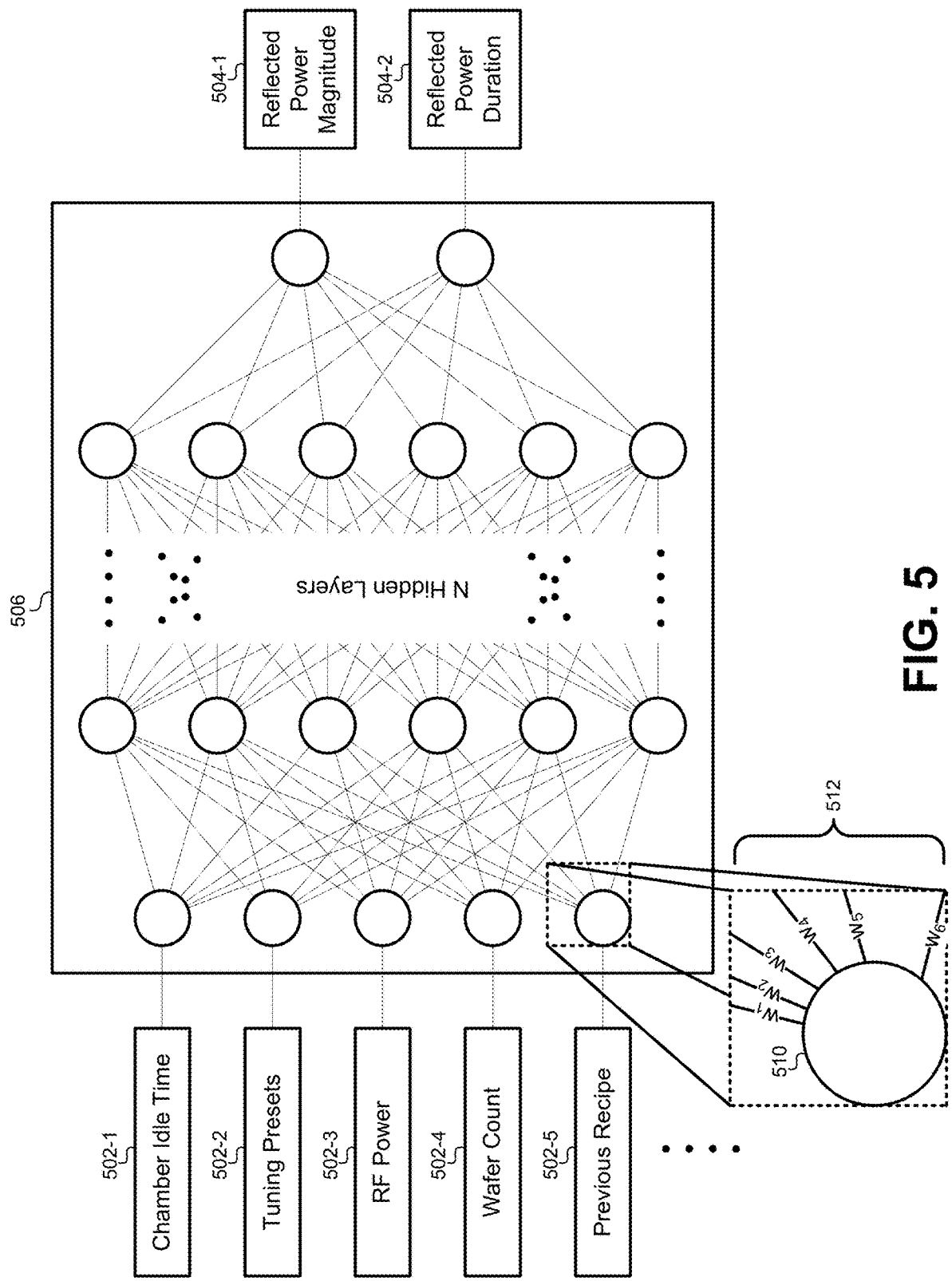
FIG. 5 illustrates how a model may be trained to output a predicted reflected RF power, according to some embodiments.

FIG. 5 illustrates how a model may be trained to output a predicted reflected RF power, according to some embodiments. By way of example, a neural network may be used as a model 516 some implementations. The neural network may be a feed-forward neural network having a plurality of hidden layers. Some embodiments may use 5-10 hidden layers having 6-10 nodes in each of the hidden layers. Each node in the neural network may include a plurality of weights that are applied to connections between nodes and subsequent layers. For example, node 510 may include a plurality of connections with individual weights 512 (e.g., $w_1, w_2, w_3, w_4, w_5,$ and $w_6$). When training the model 506, a training process may set the values for the weights 512 as described below. It should be understood that the neural network illustrated in FIG. 5 is provided only by way of example and is not meant to be limiting. Other embodiments may use other types of models instead of a neural network.

The model 506 may receive a plurality of input parameters 502 as inputs to the model 506. The input parameters 502 may include any of the input parameters described above. In some embodiments, the input parameters 502 may include a chamber idle time 502-1 that represents a time that has elapsed since a previous session when the plasma was ignited. Generally, the longer the chamber idle time 502-1, the harder the plasma is to ignite, and the more power will be reflected back to the RF source. The chamber idle time 502-1 may be measured between sessions. Alternatively, some sessions may include multiple plasma ignitions, and the chamber idle time 502-1 may be measured between when RF power stopped being applied to a previous plasma and begins being applied to a subsequent plasma regardless of whether the ignitions are in a single session or spread over multiple sessions.

The input parameters 502 may also include tuning presets 502-2. The tuning presets 502-2 may include settings for the tuning capacitors and/or tuning inductors that may be present in the processing chamber. By default, the tuning presets 502-2 may be set to identical values, then tuned to produce similar results in each of the RF meshes in the pedestal to compensate for variations in the different electrical pathways. As illustrated above in FIG. 4B, these values may be adjusted with each session to minimize the amount of reflected RF power.

The input parameters 502 may also include RF power settings 502-3 for the RF source. The RF power settings 502-3 may include waveform characteristics, frequencies, periods, voltage amplitudes, currents, output impedances, and/or any other characteristic that may be set by commands given to the RF source.

The input parameters 502 may also include a wafer count 502-4. The wafer count 502-4 may represent a number of substrates or wafers processed in the processing chamber. As physical characteristics of the processing chamber may drift over time, the wafer count may be a parameter that represents the effects of age, fatigue, degradation, and/or other effects that may be introduced into the processing chamber gradually over time and use.

The input parameters 502 may also include a previous recipe 502-5. For example, the previous recipe 502-5 may be identified by a number or other identifier. Identifying the previous recipe 502-5 may be used as a proxy for the different effects that may be caused by running particular types of recipes. For example, a previous recipe 502-5 may include an ICC cleaning process that removes hydrogen buildup on the walls of the processing chamber using He, $NF_3$, and additional inert gases. During the ICC process, the surfaces of the processing chamber may become fluorinated instead of hydrogenated, and the impedance values of the tuning capacitors will shift asymptotically during the cleaning process. In another example, referencing the previous recipe 502-5 provides a way to include the amount of electronegative gases that were present in the processing chamber. Note that these values do not need to be measured, but by identifying the previous recipe 502-5 and using that identifier as an input to the model 506, the model can automatically be trained to take all of these inherent factors from the previous recipe into account when predicting a reflected power output.

In some embodiments, the model 506 may include one or more outputs 504 that may indicate a predicted amount of RF power that may be reflected back from the processing chamber to the RF source when igniting the plasma in the processing chamber. For example, the outputs 504 may include a reflected power magnitude 504-1 representing a maximum reflected power that will be reflected back to the RF source. The outputs 504 may also include a reflected power duration 504-2 representing a duration of the reflected power signal. Some embodiments may consider the reflected power magnitude 504-1 and the reflected power duration 504-2 together and minimize the combination of these two values. For example, some embodiments may use these outputs 504 to calculate an area under a power curve that can be minimized and/or optimized.

It should be understood that the input parameters 502 and/or the outputs 504 illustrated in FIG. 5 are provided only by way of example and are not meant to be limiting. Other embodiments may include any of the input parameters described above, including settings in the recipe along with any other characteristic that may be set or measured for the processing chamber. Other outputs may also be generated, including any measurable characteristic of the reflected power from the RF source. For example, some embodiments may also predict a defect rate for the substrate.

Figure 6:
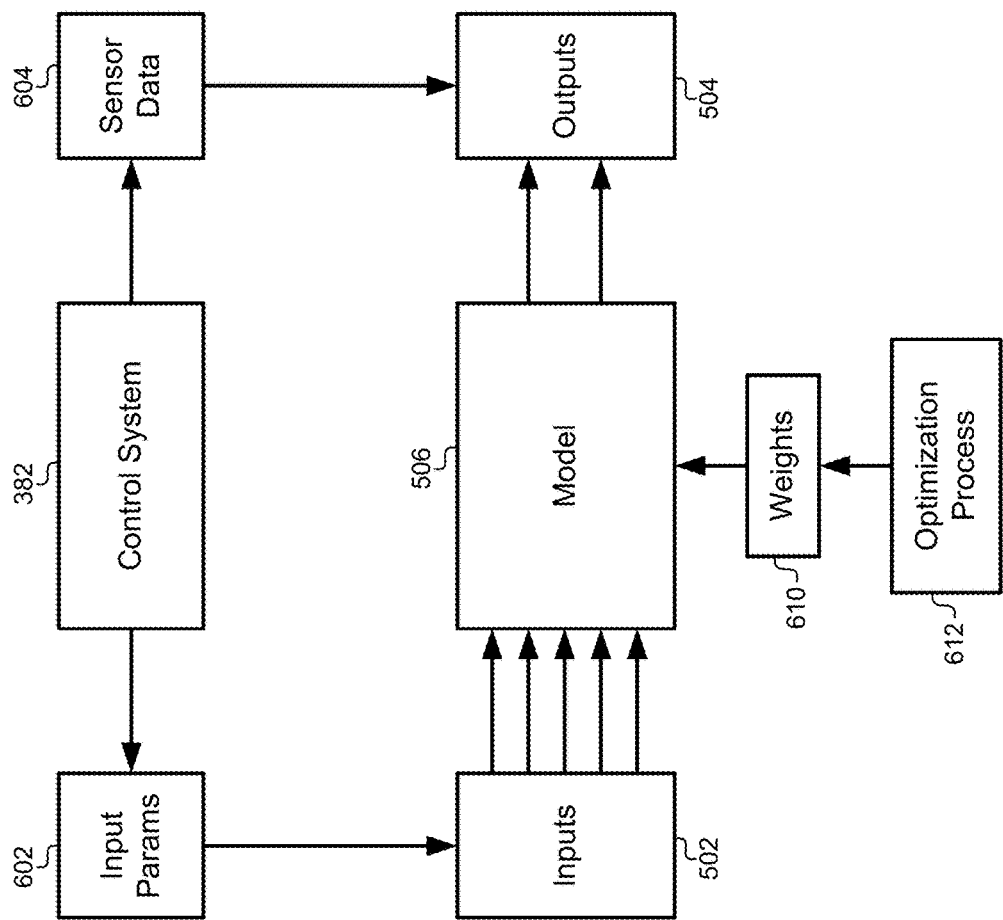
FIG. 6 illustrates how the model may be trained using historical input parameters and measured outputs from previous sessions, according to some embodiments.

FIG. 6 illustrates how the model may be trained using historical input parameters and measured outputs from previous sessions, according to some embodiments. As described above, the control system 382 may store historical pairs of input parameters and measured sensor data for sessions that were previously performed. To train the model 506, the control system 382 may provide training pairs of input/output data comprising input parameters 602 and measured sensor data 604 from individual sessions. The input parameters 602 may be provided as input parameters 502 to the model 506. The measured sensor data 604 (e.g., reflected power magnitude, reflected power duration, etc.) may be provided as outputs for training the model 506.

To train the model 506, an optimization process 612 may set or adjust the weights 610 for each of the connections in the model 506. The optimization process 612 may represent an algorithm or method that is used to change the weights 610 such that the input parameters 502 provided by the training data cause the model to generate the corresponding outputs 504 in the training data pair. For example, optimization algorithms may be used to minimize the error between the input parameters 502 and the outputs 504 for the collective set of training data pairs. Many different types of optimization algorithms may be used by the optimization process 612. Some embodiments may use a gradient descent algorithm or a stochastic gradient descent algorithm. Some embodiments may use a mini-batch gradient descent algorithm or a Nesterov accelerated gradient algorithm. Other embodiments may use algorithms such as Adagrad, AdaDelta, Adam, or other optimization algorithms.

The training data provided by the control system 382 may include any number of training pairs from previous sessions until the error of the model 506 is minimized. For example, some training processes may use 10 training pairs, 20 training pairs, 50 training pairs, 75 training pairs, 100 training pairs, and so forth. In some embodiment, the training data may be curated such that it includes measured sensor data 604 representing both high and low levels of reflected RF power. As illustrated in FIG. 4A above, a majority of the training data sets may include a measured amount of reflected RF power that is within a normal or expected range, while a smaller number of the training data sets may include a measured amount of reflected RF power that is high or unexpected. Therefore, some embodiments may filter the training data set to provide at least a threshold number of training data sets that include high amounts of reflected RF power. For example, some embodiments may ensure that a threshold percentage (e.g., approximately 10%, 15%, 20%, 25%, 30%, 40%, etc.) of the training data sets include a measured reflected RF power that is above average or above another predetermined threshold (e.g., above approximately 100 W, 110 W, 120 W, 130 W, etc.). After training the model 506, the model may represent the operation of the processing chamber during plasma ignition and may be used to generate predicted reflected RF power.

In some embodiments, a unique model may be generated for each processing chamber. Thus, the historical data for a processing chamber may be used to train the model 506 that is specific to that processing chamber. In other embodiments, the model 506 may be more generalized, and an identifier for the specific processing chamber may be provided as one of the input parameters 602. In these embodiments, historical data from a group of processing chambers may be used to train a single model that may be applicable to the group of processing chambers. This may be useful for a group of identical processing chambers for which runtime input parameters such as RF power settings and chamber idle time most heavily influence the amount of reflected RF power.

Figure 7:
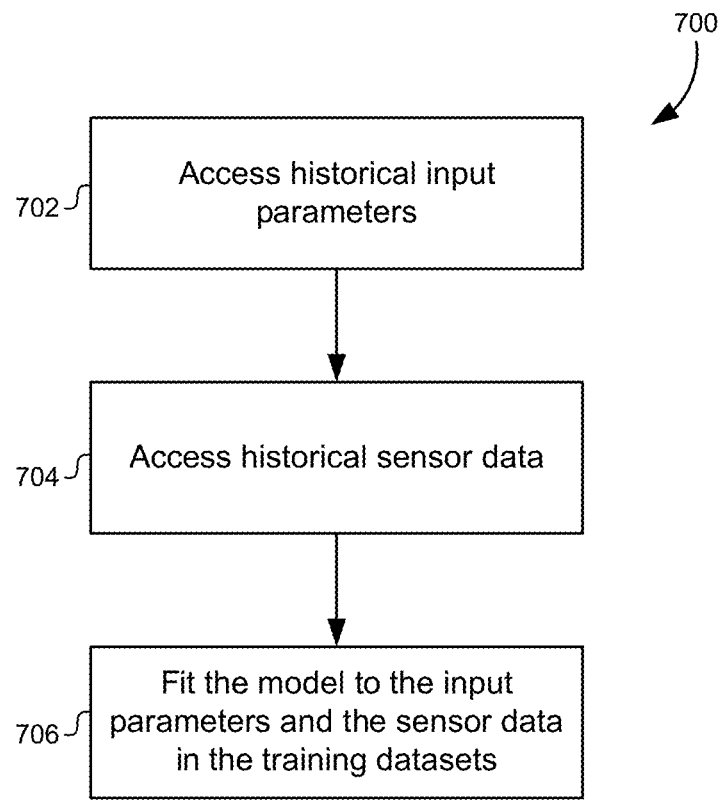
FIG. 7 illustrates a flowchart of a method of training a model, according to some embodiments.

FIG. 7 illustrates a flowchart 700 of a method of training a model, according to some embodiments. This method may be carried out by a control system, such as the local control system 384 and/or the control system 382 illustrated above in FIG. 3. This method may be carried out between wafer-processing sessions or off-line, and the method may use data stored in a database or other data storage structure.

The method may include accessing a plurality of training data sets. Each of the training data sets may include historical or previous input parameters from previous processes (702). Each of the training data sets may also include historical or previous corresponding sensor data representing an amount of RF power that was reflected back from the processing chamber (704). The method may also include training the model using the plurality of training data sets (706). Training the model may include executing an optimization algorithm to fit the weights of the model to the input parameters and sensor data from the training data sets. These operations may be executed as described above in relation to FIG. 6.

It should be appreciated that the specific steps illustrated in FIG. 6 provide particular methods of reducing reflected RF power in substrate processing chambers according to various embodiments. Other sequences of steps may also be performed according to alternative embodiments. For example, alternative embodiments may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. Many variations, modifications, and alternatives also fall within the scope of this disclosure.

Figure 8:
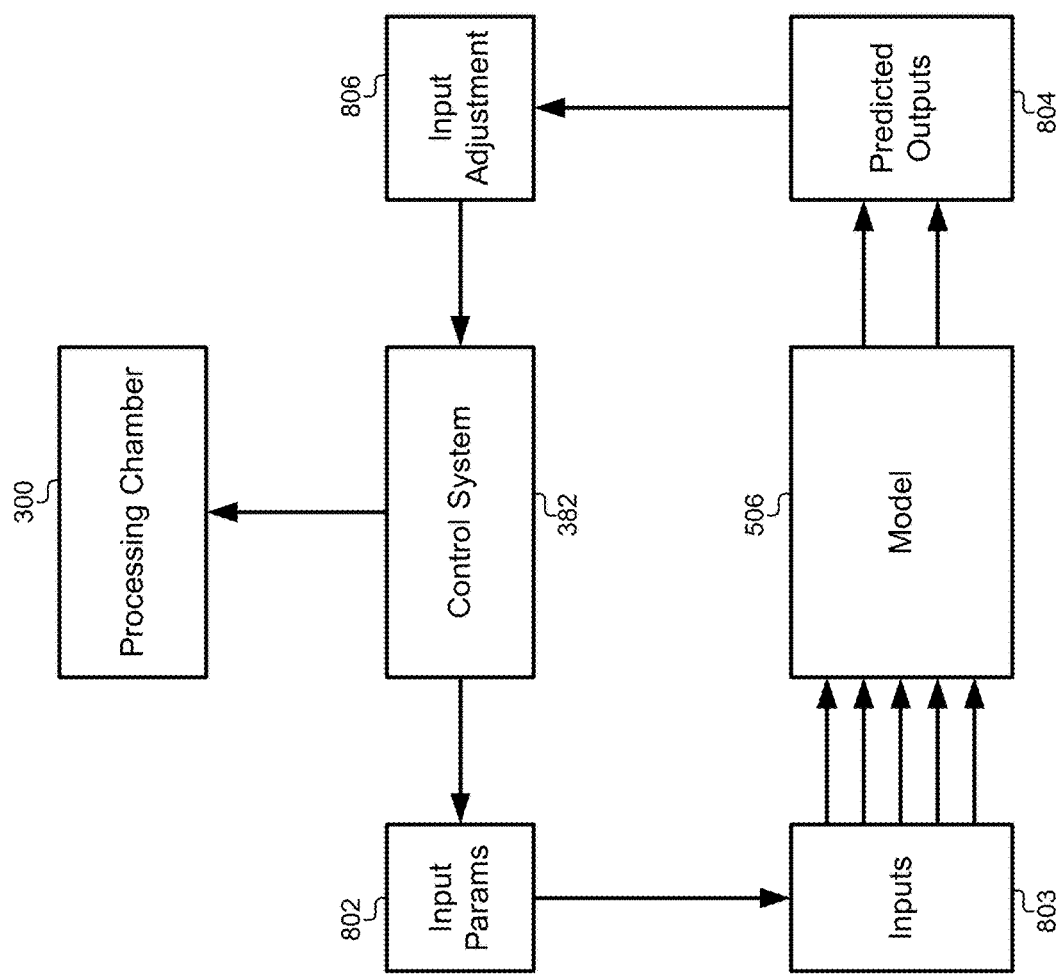
FIG. 8 illustrates how a trained model may be used to predict reflected RF power and adjust the input parameters to minimize the reflected RF power, according to some embodiments.

FIG. 8 illustrates how a trained model may be used to predict reflected RF power and adjust the input parameters to minimize the reflected RF power, according to some embodiments. Instead of using historical training sets to train the model 506, this process may use the model 560 after training has taken place to predict an amount of reflected RF power using the input parameters for a session that is about to be executed on the processing chamber. For example, a substrate or wafer may be loaded into the processing chamber as described above. The control system 382 may receive a current recipe to be executed for processing the wafer or substrate. Before causing the recipe to be executed by the processing chamber, the control system 382 may assemble the input parameters 802 for the model 506. For example, the control system 382 may assemble input parameters including a chamber idle time, capacitor/inductor preset values, RF power settings, a wafer count, a previous recipe, and so forth. The input parameters 802 may include default values for the RF power and capacitor presets that are part of the recipe. The wafer count may be incremented for each process executed by the processing chamber, and the current value may be used as an input parameter. An identifier for the previous recipe may be stored by the control system 382 and provided as one of the input parameters 802. The control system 382 may also provide a timer that records a time since a previous plasma process, and the value of this timer may be provided as the chamber idle time.

The input parameters 802 may be provided as inputs 803 to the model 506. The model 506 may have been trained previously using the process described above in FIGS. 6-7. The model 506 may then generate one or more outputs that indicate a predicted amount of RF power that may be reflected back from the processing chamber to the RF source when igniting the plasma in the processing chamber. The control system 382 may then compare the output 804 of the model 506 to one or more thresholds to determine if the predicted amount of reflected RF power is within an optimal range.

Determining whether or not the amount of reflected RF power indicated by the outputs 804 is optimized may include any and/or all of the following comparisons or operations. In some embodiments, the predicted reflected RF power may be compared to a threshold (e.g., approximately 50 W, 60 W, 75 W, 100 W, etc.). If the reflected RF power is below the threshold, then it may be considered optimized, while if the reflected RF power is above the threshold, then it may be considered not optimized or acceptable. The threshold may be determined referencing historical reflected RF power that has been measured for this same recipe. For example, a threshold may be set a number of standard deviations above an average of the historical reflected RF power (e.g., approximately 1 std dev, 2 std dev, 3 std dev, 4 std dev, etc.). In some embodiments, optimizing the amount of reflected RF power may include minimizing a predicted amount of reflected RF power as described in greater detail below.

If it is determined that the predicted amount of reflected RF power is optimized or within an optimal range, then the process may be executed using the input parameters 802. However, if it is determined that the predicted amount of RF power is not optimized or outside of an optimal range, then an adjustment 806 may be made to the input parameters. To simplify this process and narrow the solution space, it may be determined that some of the input parameters are not likely to be adjusted at this stage. For example, the chamber idle time generally should be minimized, and this time is governed by a timer since the previous plasma process. Similarly, the wafer count for the processing chamber will not typically be adjusted at this stage. The previous recipe is also not normally a parameter that will be changed by an adjustment 806 to the input parameters. In contrast, parameters that may be set as operating conditions by the control system 382 for the next operation may be more likely to be adjusted at this stage. For example, the RF power settings and/or the capacitor/inductor presets may be adjusted. This minimizes the range of adjustments to a smaller number of variables than the total number of input parameters and increases the speed with which an optimal solution may be calculated.

In some embodiments, the input parameters 802 may be adjusted by incrementing through a range of possible values. For example, the input parameter for the RF power settings may begin at a minimum output (e.g., minimum voltage), and progress through increments until a maximum voltage is reached. For example, some embodiments may use a range of 100 V (peak-to-peak) up to 1000 V (peak-to-peak). In some embodiments, the solution space may be simplified such that a local minimum may be identified while incrementing through voltages. For example, the RF voltage may increment upwards from a starting minimum voltage while the reflected RF power decreases, and may stop once an increase in reflected power begins to be observed. Similarly, the preset values for the tuning capacitors/inductors may fall within a narrow range of adjustments, and the input adjustment 806 may cycle through this range to find an optimal output value for the reflected RF power. Some embodiments may make adjustments to one input parameter at a time before moving on to additional input parameters. Alternatively, some embodiments may make an adjustment to input parameter, then cycle through possible value increments for another input parameter to test each value combination for the two input parameters. For example, the voltage output of the RF source may be increased by one volt, and the tuning capacitance values may then step through each incremental value at that voltage.

Some embodiments may determine whether or not the predicted amount of reflected RF power is optimized by minimizing the predicted reflected RF power. This may be calculated by cycling through incremental value of the input parameters to test each combination of the different available input parameter values. For example, each combination of capacitor preset values and output settings on the RF source may be passed through the model 506 to generate predicted outputs. The combination of values for these input parameters that generate a minimum predicted reflected RF power may be considered the optimal value.

Some embodiments may use the default values from the recipe as initial values for the process defected in FIG. 8. Other embodiments may use values previously determined to be optimized input values for the same recipe. For example, when running recipe A, the input parameters 802 may use the optimal input parameters determined from a previous run of recipe A as a starting point. This may reduce a time required to identify an optimized solution by moving the starting point for the model process closer to a local minimum in the solution space.

Once the input parameters that generate an optimized predicted reflected RF power are identified, these input parameters may be used to execute the recipe on the processing chamber 300. For example, the optimized values for the RF source settings and the capacitor/inductor preset values may be sent to the processing chamber 300 as part of the recipe. This process of identifying optimal input parameters that generate an optimal amount of reflected RF power may be carried out automatically by the control system 382 without requiring additional human input during the process. For example, an operator may provide an input instructing the control system 382 to execute recipe A. The control system 382 may then automatically load the model 506 and execute the optimization process described above. The optimized control values for the RF source and/or the capacitor/inductor preset values may then be substituted in the recipe and provided automatically to the processing chamber 300 for execution.

In some embodiments, the control system 382 may provide recommendations through a user interface of the control system 382 to make changes to the execution of a current recipe. The control system 382 may also provide a request to authorize recommended changes to be implemented automatically. For example, the control system 382 may vary the identifier for the previous recipe (even though the actual previous recipe has already been executed). This may identify patterns in the sequence in which recipes are run that may affect performance. For example, the model 506 may show that repeatedly running recipe A continually increases the amount of reflected RF power with each run. By varying the identifier of the previous recipe in the input parameters 802, the model 506 may show that alternating recipe A with recipe B may reduce the reflected RF power for both recipes. When this situation is identified by the control system 382, recommendation may be made through the user interface to change the recipe execution order.

The process of training the model 506 may be an ongoing process such that the model 506 is incrementally trained after each recipe is executed. For example, after the processing chamber 300 has executed a recipe using optimized input parameters as described above, the processing chamber 300 may provide sensor data indicating the actual measured amount of reflected RF power for that run of the recipe. The input parameters 802 and the sensor data may be stored in the database as another training pair that may be provided to the training process for the model 506 described above in FIGS. 6-7. Additionally, some embodiments may use the measured sensor data to identify malfunctions or degradation of the processing chamber. For example, the measured sensor data may be compared to the predicted reflected RF power in the predicted outputs 804 from the model 506. If the predicted outputs 804 deviate from the measured sensor data by more than a percentage or threshold amount, the control system 382 may generate an indication of this deviation, and this indication may be transmitted to a user. This deviation may indicate a problem with the processing chamber 300 and/or may be used to track performance degradation over time as the processing chamber 300 ages.

Figure 9:
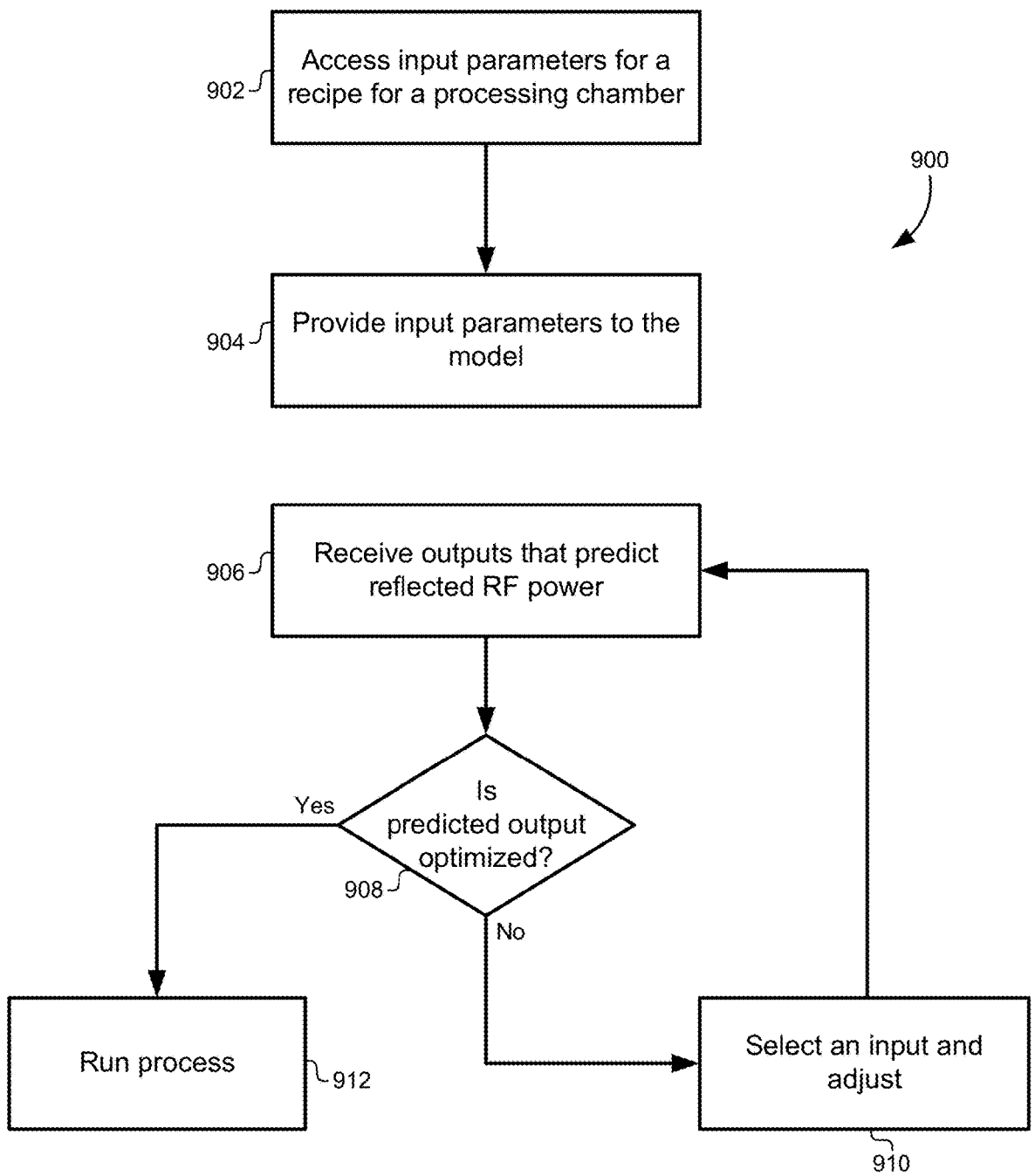
FIG. 9 illustrates a flowchart of a method of reducing reflected RF power in substrate processing chambers, according to some embodiments.

FIG. 9 illustrates a flowchart 900 of a method of reducing reflected RF power in substrate processing chambers, according to some embodiments. This method may be carried out by a control system, such as the local control system 384 and/or the control system 382 illustrated above in FIG. 3. This method may be carried out at runtime prior to the execution of a recipe in the processing chamber. As described above, this method may be executed after receiving a recipe to make adjustments to the input parameters before the recipe is executed.

The method may include accessing a plurality of input parameters for a processing chamber (902). The plurality of inputs may be in part derived from a recipe for the processing chamber to perform a process on the substrate. For example, the input parameters may include RF source settings and/or capacitor/inductance preset values from a recipe. The input parameters may also be derived in part from values stored by the control system, such as a wafer count, a chamber idle time, a previous recipe, and/or the like.

The method may also include providing the plurality of input parameters to a model (904). The model may be trained using the process described above in FIGS. 6-7. For example, the model may have been trained using previous training pairs of input parameters and corresponding sensor measurements. The sensor measurements may include characteristics of reflected RF power measured during plasma ignition. The model may be specific to the processing chamber and/or specific to the recipe.

The method may additionally include receiving one or more first outputs from the model that indicate a predicted first amount of RF power that will be reflected back from the processing chamber to an RF source when igniting a plasma in the processing chamber (906). These outputs may include a predicted maximum reflected RF power and/or a predicted reflected RF power duration. The process of providing input parameters to the model and receiving predicted outputs may be carried out according to FIG. 8 above. Note that the "first" amount of RF power is designated as such only to distinguish this predicted result from predicted results that will be generated later in this process.

The method may further include determining that the predicted first amount of RF power that is reflected back from the processing chamber is not optimized (908). For example, it may be determined that the predicted reflected RF power exceeds a predetermined threshold (e.g., 50 W), and is thus not optimized. In some cases, it may be determined that a minimum value for the predicted reflected RF power has not yet been determined for the range of possible input parameter values that will be processed by the model. This optimization process may be carried out as described above according to FIG. 8.

After determining that the output is not yet optimized, the method may include adjusting the plurality of input parameters for the processing chamber to generate adjusted input parameters (910). As described above, this process may include selecting and making an adjustment to one input parameter at a time. As illustrated in FIG. 9, this process may cycle repeatedly as adjustments are made to the various input parameters. Thus, after making an adjustment, the method may include providing the adjusted input parameters for the processing chamber to the model, and receiving one or more second outputs from the model that indicate predict a second amount of RF power that will be reflected back from the processing chamber to the RF source (906). Note that the "second" amount of RF power is designated as such merely to distinguish a subsequent result of the model from a previous result of the model. It should be understood that this process of generating "second" outputs from the model may be repeated as many times as is needed to identify and optimize result.

The method may also include determining that at least one of the predicted "second" amounts of RF power that is reflected back to the processing chamber is optimized (908). As described above in relation to FIG. 8, this optimized value may be identified by comparison to a threshold. This optimized value may also be identified by determining a minimum predicted reflected RF power generated over the range of input parameter adjustments as processed by the model. The adjusted input parameters may then be provided to the processing chamber to perform the process on the substrate (912). For example, the RF power settings and/or capacitor/inductor preset values may be provided as part of the recipe to the processing chamber to execute the process.

It should be appreciated that the specific steps illustrated in FIG. 9 provide particular methods of reducing reflected RF power in substrate processing chambers according to various embodiments. Other sequences of steps may also be performed according to alternative embodiments. For example, alternative embodiments may perform the steps outlined above in a different order. Moreover, the individual steps illustrated in FIG. 9 may include multiple sub-steps that may be performed in various sequences as appropriate to the individual step. Furthermore, additional steps may be added or removed depending on the particular applications. Many variations, modifications, and alternatives also fall within the scope of this disclosure.

Each of the methods described herein may be implemented by a computer system. Each step of these methods may be executed automatically by the computer system, and/or may be provided with inputs/outputs involving a user. For example, a user may provide inputs for each step in a method, and each of these inputs may be in response to a specific output requesting such an input, wherein the output is generated by the computer system. Each input may be received in response to a corresponding requesting output. Furthermore, inputs may be received from a user, from another computer system as a data stream, retrieved from a memory location, retrieved over a network, requested from a web service, and/or the like. Likewise, outputs may be provided to a user, to another computer system as a data stream, saved in a memory location, sent over a network, provided to a web service, and/or the like. In short, each step of the methods described herein may be performed by a computer system, and may involve any number of inputs, outputs, and/or requests to and from the computer system which may or may not involve a user. Those steps not involving a user may be said to be performed automatically by the computer system without human intervention. Therefore, it will be understood in light of this disclosure, that each step of each method described herein may be altered to include an input and output to and from a user, or may be done automatically by a computer system without human intervention where any determinations are made by a processor. Furthermore, some embodiments of each of the methods described herein may be implemented as a set of instructions stored on a tangible, non-transitory storage medium to form a tangible software product.

Figure 10:
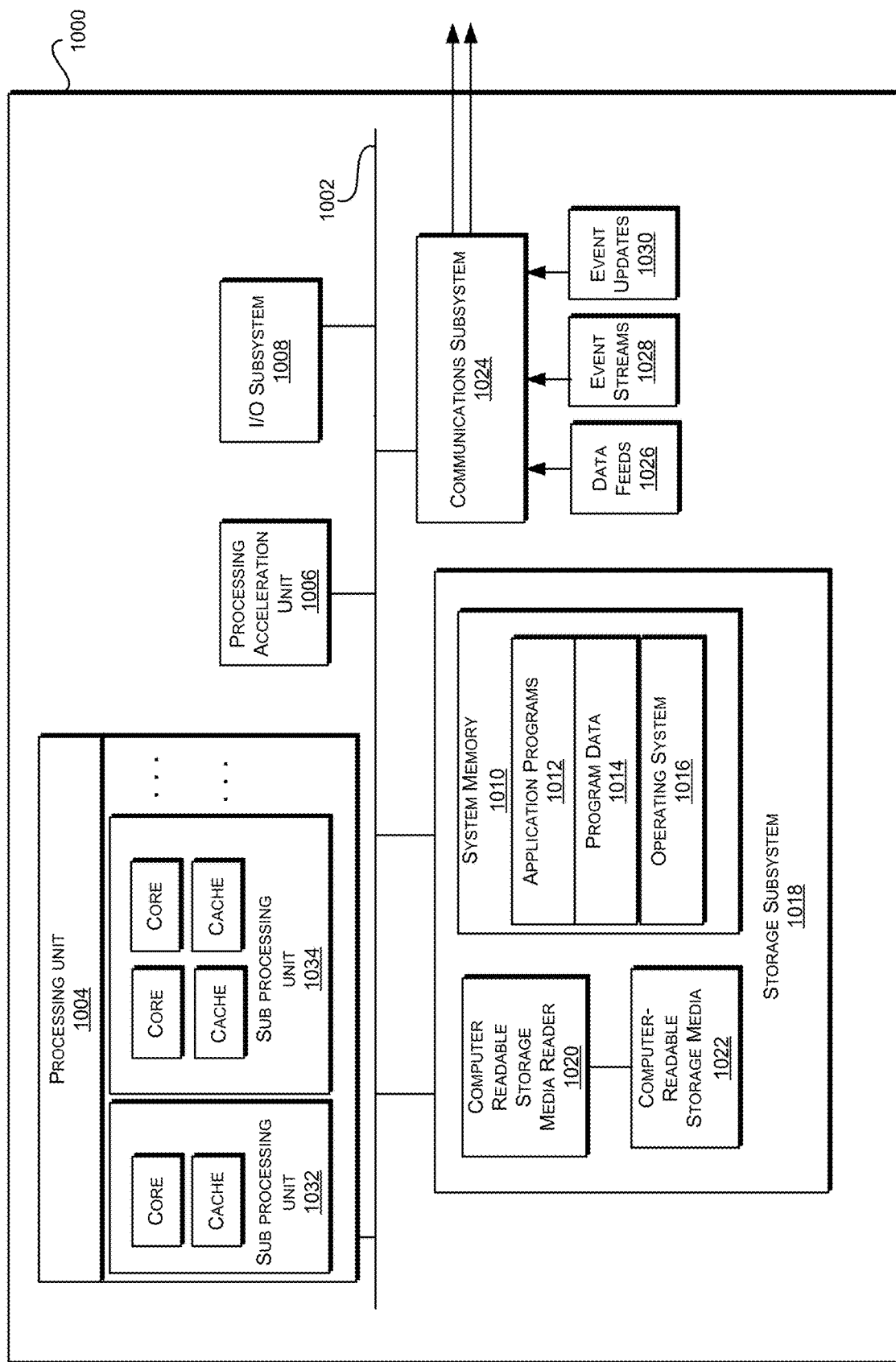
FIG. 10 illustrates an exemplary computer system, in which various embodiments may be implemented.

FIG. 10 illustrates an exemplary computer system 1000, in which various embodiments may be implemented. The computer system 1000 may be used to implement any of the computer systems described above. As shown in the figure, computer system 1000 includes a processing unit 1004 that communicates with a number of peripheral subsystems via a bus subsystem 1002. These peripheral subsystems may include a processing acceleration unit 1006, an I/O subsystem 1008, a storage subsystem 1018 and a communications subsystem 1024. Storage subsystem 1018 includes tangible computer-readable storage media 1022 and a system memory 1010.

Bus subsystem 1002 provides a mechanism for letting the various components and subsystems of computer system 1000 communicate with each other as intended. Although bus subsystem 1002 is shown schematically as a single bus, alternative embodiments of the bus subsystem may utilize multiple buses. Bus subsystem 1002 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 1004, which can be implemented as one or more integrated circuits (e.g., a conventional microprocessor or microcontroller), controls the operation of computer system 1000. One or more processors may be included in processing unit 1004. These processors may include single core or multicore processors. In certain embodiments, processing unit 1004 may be implemented as one or more independent processing units 1032 and/or 1034 with single or multicore processors included in each processing unit. In other embodiments, processing unit 1004 may also be implemented as a quad-core processing unit formed by integrating two dual-core processors into a single chip.

In various embodiments, processing unit 1004 can execute a variety of programs in response to program code and can maintain multiple concurrently executing programs or processes. At any given time, some or all of the program code to be executed can be resident in processing unit 1004 and/or in storage subsystem 1018. Through suitable programming, processing unit 1004 can provide various functionalities described above. Computer system 1000 may additionally include a processing acceleration unit 1006, which can include a digital signal processor (DSP), a special-purpose processor, and/or the like.

I/O subsystem 1008 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. User interface input devices may include, for example, motion sensing and/or gesture recognition devices such as the Microsoft Kinect® motion sensor that enables users to control and interact with an input device, such as the Microsoft Xbox® 360 game controller, through a natural user interface using gestures and spoken commands. User interface input devices may also include eye gesture recognition devices such as the Google Glass® blink detector that detects eye activity (e.g., 'blinking' while taking pictures and/or making a menu selection) from users and transforms the eye gestures as input into an input device (e.g., Google Glass®). Additionally, user interface input devices may include voice recognition sensing devices that enable users to interact with voice recognition systems (e.g., Siri® navigator), through voice commands.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, position emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 1000 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 1000 may comprise a storage subsystem 1018 that comprises software elements, shown as being currently located within a system memory 1010. System memory 1010 may store program instructions that are loadable and executable on processing unit 1004, as well as data generated during the execution of these programs.

Depending on the configuration and type of computer system 1000, system memory 1010 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 1004. In some implementations, system memory 1010 may include multiple different types of memory, such as static random access memory (SRAM) or dynamic random access memory (DRAM). In some implementations, a basic input/output system (BIOS), containing the basic routines that help to transfer information between elements within computer system 1000, such as during start-up, may typically be stored in the ROM. By way of example, and not limitation, system memory 1010 also illustrates application programs 1012, which may include client applications, Web browsers, mid-tier applications, relational database management systems (RDBMS), etc., program data 1014, and an operating system 1016. By way of example, operating system 1016 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 1018 may also provide a tangible computer-readable storage medium for storing the basic programming and data constructs that provide the functionality of some embodiments. Software (programs, code modules, instructions) that when executed by a processor provide the functionality described above may be stored in storage subsystem 1018. These software modules or instructions may be executed by processing unit 1004. Storage subsystem 1018 may also provide a repository for storing data used in accordance with some embodiments.

Storage subsystem 1018 may also include a computer-readable storage media reader 1020 that can further be connected to computer-readable storage media 1022. Together and, optionally, in combination with system memory 1010, computer-readable storage media 1022 may comprehensively represent remote, local, fixed, and/or removable storage devices plus storage media for temporarily and/or more permanently containing, storing, transmitting, and retrieving computer-readable information.

Computer-readable storage media 1022 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 1000.

By way of example, computer-readable storage media 1022 may include a hard disk drive that reads from or writes to non-removable, nonvolatile magnetic media, a magnetic disk drive that reads from or writes to a removable, non-volatile magnetic disk, and an optical disk drive that reads from or writes to a removable, nonvolatile optical disk such as a CD ROM, DVD, and Blu-Ray® disk, or other optical media. Computer-readable storage media 1022 may include, but is not limited to, Zip® drives, flash memory cards, universal serial bus (USB) flash drives, secure digital (SD) cards, DVD disks, digital video tape, and the like. Computer-readable storage media 1022 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 1000.

Communications subsystem 1024 provides an interface to other computer systems and networks. Communications subsystem 1024 serves as an interface for receiving data from and transmitting data to other systems from computer system 1000. For example, communications subsystem 1024 may enable computer system 1000 to connect to one or more devices via the Internet. In some embodiments communications subsystem 1024 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 1024 can provide wired network connectivity (e.g., Ethernet) in addition to or instead of a wireless interface.

In some embodiments, communications subsystem 1024 may also receive input communication in the form of structured and/or unstructured data feeds 1026, event streams 1028, event updates 1030, and the like on behalf of one or more users who may use computer system 1000.

By way of example, communications subsystem 1024 may be configured to receive data feeds 1026 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 1024 may also be configured to receive data in the form of continuous data streams, which may include event streams 1028 of real-time events and/or event updates 1030, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 1024 may also be configured to output the structured and/or unstructured data feeds 1026, event streams 1028, event updates 1030, and the like to one or more databases that may be in communication with one or more streaming data source computers coupled to computer system 1000.

Computer system 1000 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 1000 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

As used herein, the term "approximately" may indicate a value that is within 10% of a specified value. For example, approximately 50 W implies a range of between 45 W and 55 W.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to, portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A method of reducing reflected Radio Frequency (RF) power in substrate processing chambers, the method comprising:
    accessing a plurality of input parameters for a processing chamber, wherein the plurality of input parameters are in part derived from a recipe for the processing chamber to perform a process on a substrate;
    providing the plurality of input parameters for the processing chamber to a model, wherein the model has been trained using previous pluralities of input parameters and corresponding pluralities of sensor measurements;
    receiving one or more first outputs from the model that indicate a predicted first amount of RF power that will be reflected back from the processing chamber to an RF source when igniting a plasma in the processing chamber; and
    adjusting the plurality of input parameters based on the predicted first amount of RF power that is reflected back from the processing chamber.

2. The method of claim 1, further comprising:
    determining that the predicted first amount of RF power that is reflected back from the processing chamber is not optimized;
    adjusting the plurality of input parameters for the processing chamber to generate adjusted input parameters;
    providing the adjusted input parameters for the processing chamber to the model;
    receiving one or more second outputs from the model that indicate a predicted second amount of RF power that will be reflected back from the processing chamber to the RF source;
    determining that the predicted second amount of RF power that is reflected back from the processing chamber is optimized; and
    providing the adjusted input parameters to the processing chamber to perform the process on the substrate.

3. The method of claim 2, wherein determining that the predicted second amount of RF power that is reflected back from the processing chamber is optimized comprises:
    determining that the second amount of RF power represents a minimum value of reflected RF power predicted by the model over a range of values for each of the plurality of input parameters.

4. The method of claim 2, wherein determining that the predicted second amount of RF power that is reflected back from the processing chamber is optimized comprises:
    determining that the second amount of RF power is less than a predetermined threshold.

5. The method of claim 2, wherein the operations further comprise:
    measuring sensor data representing an amount of RF power that is reflected back from the processing chamber during the process; and
    comparing the measured sensor data to the predicted second amount of RF power.

6. The method of claim 2, wherein the operations further comprise:
    generating an indication provided to a user interface when the measured sensor data exceeds the predicted second amount of RF power by more than a predetermined threshold amount.

7. The method of claim 1, wherein the process comprises a plasma etch process on the substrate.

8. A system comprising:
    one or more processors; and
    one or more memory devices comprising instructions that, when executed by the one or more processors, cause the one or more processors to perform operations comprising:
        accessing a plurality of input parameters for a processing chamber, wherein the plurality of input parameters are in part derived from a recipe for the processing chamber to perform a process on a substrate;
        providing the plurality of input parameters for the processing chamber to a model, wherein the model has been trained using previous pluralities of input parameters and corresponding pluralities of sensor measurements;

receiving one or more first outputs from the model that indicate a predicted first amount of RF power that will be reflected back from the processing chamber to an RF source when igniting a plasma in the processing chamber; and adjusting the plurality of input parameters based on the predicted first amount of RF power that is reflected back from the processing chamber.

9. The system of claim 8, wherein the plurality of input parameters comprises settings for an RF source for the processing chamber.

10. The system of claim 8, wherein the plurality of input parameters comprises a wafer count representing a number of processes previously executed on substrates in the processing chamber.

11. The system of claim 8, wherein the plurality of input parameters comprises a chamber idle time representing a time since a previous plasma process was completed in the processing chamber.

12. The system of claim 8, wherein the plurality of input parameters comprises an identifier for a previous recipe executed in the processing chamber.

13. The system of claim 8, wherein the plurality of input parameters comprises preset values for one or more tuning capacitors in the processing chamber.

14. The system of claim 8, wherein the plurality of input parameters comprises preset values for one or more tuning inductors in the processing chamber.

15. A non-transitory computer-readable medium comprising instructions that, when executed by one or more processors, cause the one or more processors to perform operations comprising:

accessing a plurality of input parameters for a processing chamber, wherein the plurality of input parameters are in part derived from a recipe for the processing chamber to perform a process on a substrate;

providing the plurality of input parameters for the processing chamber to a model, wherein the model has been trained using previous pluralities of input parameters and corresponding pluralities of sensor measurements;

receiving one or more first outputs from the model that indicate a predicted first amount of RF power that will be reflected back from the processing chamber to an RF source when igniting a plasma in the processing chamber; and adjusting the plurality of input parameters based on the predicted first amount of RF power that is reflected back from the processing chamber.

16. The non-transitory computer-readable medium of claim 15, wherein the predetermined threshold is approximately 50 W.

17. The non-transitory computer-readable medium of claim 15, wherein the operations further comprise:

accessing a plurality of training data sets, wherein each of the plurality of training data sets comprises:

a plurality of previous input parameters from a previous process; and corresponding sensor data representing an amount RF power that was reflected back from the processing chamber during the process;

training the model using the plurality of training data sets.

18. The non-transitory computer-readable medium of claim 17, wherein the operations further comprise curating the plurality of training data sets such that the plurality of training data sets includes at least a threshold number of training data sets comprising sensor data representing above-average amounts of RF power that was reflected back in the processing chamber.

19. The non-transitory computer-readable medium of claim 15, wherein the model comprises a neural network with a first output indicating a predicted maximum RF power and a second output indicating a predicted RF power duration.

20. The non-transitory computer-readable medium of claim 15, wherein the model comprises a neural network that includes a plurality of hidden layers and inputs corresponding to the input parameters, and that has been trained using an optimization process to set weights between internal nodes of the neural network.

* * * * *